United States Patent
Johnson et al.

(10) Patent No.: US 6,515,865 B2
(45) Date of Patent: Feb. 4, 2003

(54) CYLINDRICAL BATTERY CLIP FOR KEY FOBS

(75) Inventors: Susan Johnson, Rochester, MI (US); Tejas B. Desai, Sterling Heights, MI (US); Kyle Cleland, Shelby Township, MI (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 0 days.

(21) Appl. No.: 09/867,019

(22) Filed: May 29, 2001

(65) Prior Publication Data

US 2002/0030602 A1 Mar. 14, 2002

Related U.S. Application Data

(60) Provisional application No. 60/213,004, filed on Jun. 21, 2000, and provisional application No. 60/219,081, filed on Jul. 18, 2000.

(51) Int. Cl.[7] ................................................ H01M 2/10
(52) U.S. Cl. ...................... 361/752; 361/774; 174/260; 174/267; 429/96; 429/146; 439/627
(58) Field of Search ................................ 361/760, 781, 361/782, 814, 807–811, 752, 774; 429/96–100, 146; 340/572.8; 174/260, 267; 439/500, 627; 455/90, 347, 575; 257/924

(56) References Cited

U.S. PATENT DOCUMENTS

| | | | |
|---|---|---|---|
| 4,487,820 A | * 12/1984 | Engelstein et al. | 429/100 |
| 5,642,265 A | * 6/1997 | Bond et al. | 361/809 |
| 5,796,588 A | 8/1998 | Machida et al. | 429/100 |
| 5,845,217 A | * 12/1998 | Lindell et al. | 455/575 |

FOREIGN PATENT DOCUMENTS

| | | |
|---|---|---|
| DE | 4421496 A1 | 4/1995 |
| EP | 0580886 A1 | 2/1994 |
| JP | 61002264 | 1/1986 |

OTHER PUBLICATIONS

International Search Report completed Oct. 29, 2001.

* cited by examiner

*Primary Examiner*—Kamand Cuneo
*Assistant Examiner*—John B. Vigushin

(57) ABSTRACT

An improved and low cost electrical connection for use in circuit boards for key fobs incorporates a plurality of generally cylindrical pin members which are symmetric about a central axis. The use of the symmetric pin allows automatic insertion of the pin in that the orientation of the pin relative to the board is unimportant. The pin has a generally tapered transition portion which provides a contact surface for the battery, and this transition portion is also symmetric such that the orientation of the pin relative to the board is unimportant. Further, a stop face on the pin provides a stop for insertion of the pin into the circuit board such that the pin is at the desired height relative to the battery and such that the transition portion will provide electrical contact to the battery.

14 Claims, 1 Drawing Sheet

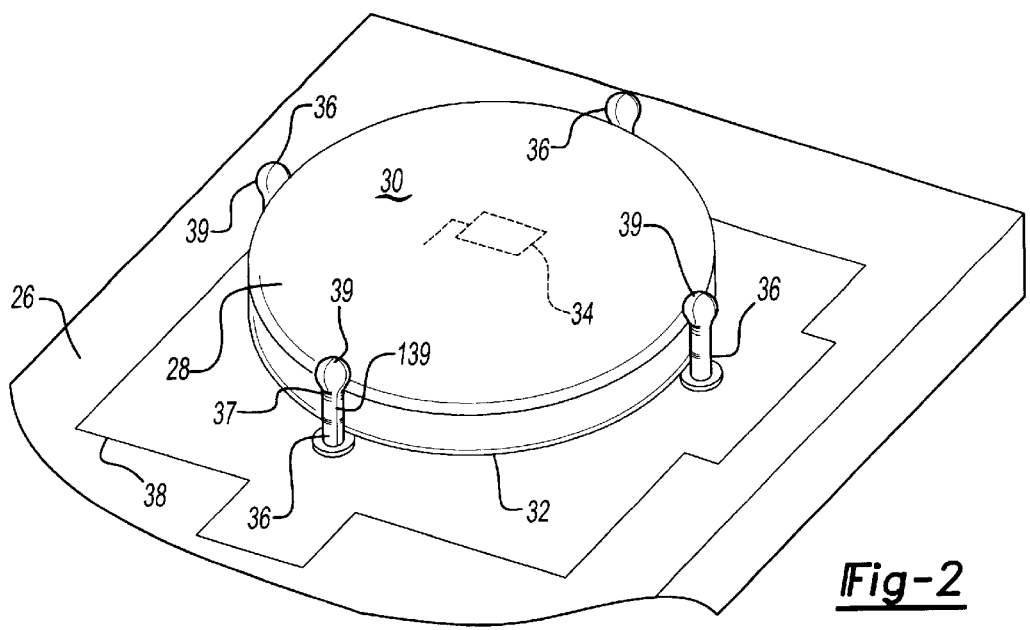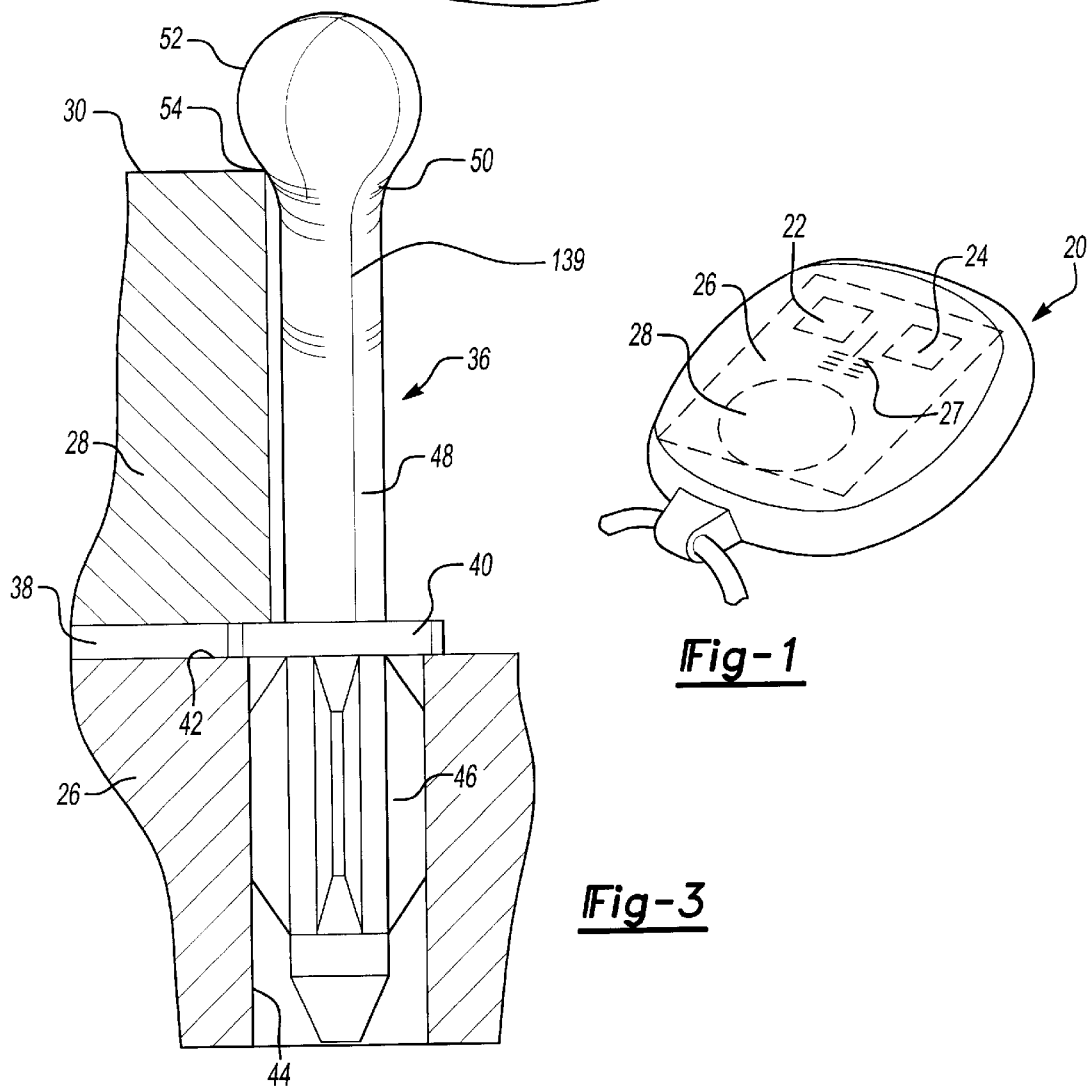

CYLINDRICAL BATTERY CLIP FOR KEY FOBS

BACKGROUND OF THE INVENTION

This application claims priority to Provisional Patent Applications Ser. Nos. 60/213,004 filed Jun. 21, 2000 and 60/219,081 filed Jul. 18, 2000.

The application relates to an improvement in contact pins for providing an electrical contact between a battery and a circuit board in a remote signaling device.

Modern vehicles are provided with a remote signaling device typically known as a key fob. A key fob includes an RF receiver/transmitter and a plurality of switches. The switches are utilized to communicate a signal to a vehicle remotely, and instruct changes in status for various components on the vehicle. Typically, the key fob will include the ability to request the doors to be opened or locked, and the trunk to be opened. Other commands such as memory function, remote ignition, etc. are often also incorporated into these remote signaling devices.

The remote signaling devices are also provided with a small replaceable battery. Typically, the battery is generally cylindrical and received between structural mounts which provide electrical contacts on each of the two exposed faces of the battery. The structural mounts have typically been generally cylindrical sections which extend for a good deal of distance circumferentially. These mounts have been relatively complex to manufacture and assemble. Due to the unique shape of these generally cylindrical sections, the insertion of these contacts into the circuit board has typically required manual assembly.

The key fobs are manufactured in the millions, and the requirement for manual assembly steps is undesirable. It would be desirable to provide contacts which could be assembled by automatic processes. Further, it would be desirable to provide a less expensive contact structure.

SUMMARY OF THE INVENTION

In the disclosed embodiment of this invention, the contact pin is force fit into the opening in the circuit board. The contact pin has an upper enlarged portion and a generally elongate thinner extending portion. The extending portion extends along the length of the battery and the enlarged portion fits over the top of the battery. Preferably, the pin is generally symmetrical. Since the pin is symmetrical, its orientation relative to the circuit board is unimportant, which facilitates automatic insertion of the pin into the board. Most preferably, the pin is generally cylindrical and the enlarged portion is generally spherical. A transition portion between the elongate portion and the spherical portion is preferably generally tapered, or frustro-conical.

Further, at the remote end of the pin from the enlarged portion is an enlarged tab which abuts the upper surface of the board, and provides a stop for the pin into the hole in the board. In this fashion, the pin is not inserted into the board for too great a distance, such that it is at the proper desired height relative to the battery.

Stated another way, the pin is preferably of a dimension such that it extends circumferentially for about the same distance as it extends radially. The term "about" as utilized in context of this application would require that the radial dimension is at least 66% of the circumferential dimension, more preferably within 80%, and most preferably the pin is symmetric such that the two dimensions are effectively equal.

These and other features of the present invention can be best understood from the following specification and drawings, the following of which is a brief description.

BRIEF DESCRIPTION OF THE DRAWINGS

FIG. 1 schematically shows a key fob.

FIG. 2 shows a circuit board as part of the key fob.

FIG. 3 is a cross-sectional view through the inventive pin and circuit board.

DETAILED DESCRIPTION OF A PREFERRED EMBODIMENT

A key fob 20 is illustrated in FIG. 1 having switches 22 and 24, as known to send a remote signal to a vehicle. As part of the key fob, an integrated circuit board 26 communicates between the switches, a receiver/transmitter 27, shown schematically, and a battery 28. As known, the battery powers the receiver/transmitter and the appropriate signals are sent upon actuation of any one of the switches 22 and 24.

As shown in FIG. 1, the circuit board 26 receives the battery 28. The battery 28 has an upper face 30 and a lower face 32. The lower face 32 communicates with a contact 34 that provides an electrical connection to the lower face of the battery 32. Typically, this is the negative connection for the battery. The circuit board 26 is further provided with a plurality of electrically conductive pins 36 which communicate with circuitry 28 on the board 26. The circuitry is shown schematically, and the exact circuitry to be utilized forms no portion of this invention. As shown, preferably there are a plurality of pins 36 spaced circumferentially about the battery, and the battery is generally cylindrical. As can be seen, the pins preferably have a head 39 which may be formed by bending together a plurality of separate metal portions. As further shown, a length 37 of the pins 36 has a seam 139. The pin may thus be rolled from a sheet of appropriate metal.

Details of the shape of the pin can be best understood from FIG. 3.

As shown in FIG. 3, the pin 36 is holding the battery 30 and is mounted within the circuit board 42. A outwardly extending tab 40 on the pin 36 abuts an upper face 42 of the board 26. A lower portion 46 of the pin is interference fit into a hole 44 within the bore 26. Generally, the structure of the pin at its lower end is as known for electrical contact pins, and forms no portion of this invention. However, providing the tab 40 to prevent over-insertion of the pin is a novel aspect of this invention.

The pin further includes an elongate generally cylindrical portion 48 extending along the majority of the length of the battery 30. A transition or tapered portion 50 extends from the portion 48 to an enlarged portion, shown as a spherical cap 52. As shown, a portion 54 of the transition portion 50 abuts an upper edge of the battery 30 providing electrical communication between the upper surface 30 of the battery 28 and the pins 36. Further, the pins 36 by being spaced circumferentially around the battery provide a sufficient holding force holding the battery in a removable and replaceable fashion.

The pin preferably has a generally cylindrical section at area 40 and area 48. The portion 52 is generally spherical, and is also generally symmetrical. The transition portion 50 is also generally symmetrical.

The portions 50 and 52 are the portions which contact the battery, and by having these portions be symmetrical, the invention facilitates machine insertion. It is not necessary to insure any particular orientation of the pin 36 relative to the circuit board 26 since each pin is symmetric. Any particular orientation would still provide the electrical connection between transition area 50 and the battery 28.

Thus, in a preferred embodiment of this invention, a pin is utilized with the remote signaling device wherein the pin has a generally symmetric shape around the center axis of the pin, at least in the area wherein there will be contact between the pin and the battery. By "generally symmetric" this application would allow deviation from the symmetric as may be experienced in individually prepared pins. However, it is preferred that the design of the pin be close to symmetric given the realities of modem manufacturing.

Further, stated another way, the pin preferably has a circumferential extent when inserted into the board and relative to the battery that is generally equal to the radial extent of the pin when inserted in the board and measured relative to the battery center axis. By "generally equal" this application implies that the radial dimension is preferably at least 66% of the circumferential dimension. More preferably, the radial dimension is at least 80% of the circumferential dimension, and most preferably, again, it is preferred the radial dimension is effectively equal to the circumferential dimension.

Although a preferred embodiment of this invention has been disclosed, a worker of this art would recognize that certain modifications would come within the scope of this invention. As an example, the stop base 40 could be utilized with other shaped pins, and various other shapes of symmetric pins could be utilized. For this reason, the following claims should be studied to determine the true scope and content of this invention.

What is claimed is:

1. A remote signaling device for a vehicle comprising:
   a housing incorporating a receiver/transmitter and a circuit board, switches on said housing allowing selective communication of signals through said receiver/transmitter; and
   a battery secured to said circuit board by at least one electrically conductive pin, said electrically conductive pin contacting an upper face of said battery to provide electrical communication to said circuit board, and said pin being generally symmetrical about a central axis of said pin, said pin extending from said circuit board along a length of said battery to contact said upper face of said battery such that said pin is secured to said circuit board below said battery, but provides electrical communication through a contact with said upper face of said battery.

2. A remote signaling device as recited in claim 1, wherein there are a plurality of said electrically conductive pins spaced about a center axis of said battery.

3. A remote signaling device as recited in claim 1, wherein a tab on said pin has an enlarged outer diameter which abuts an upper surface of said circuit board, and an insertion portion of said pin extending downwardly into a hole of said circuit board, said tab portion providing a stop to properly position said pin.

4. A remote signaling device as recited in claim 1, wherein said pin has an enlarged upper portion which contacts said upper face of said battery.

5. A remote signaling device for a vehicle comprising:
   a housing incorporating a receiver/transmitter and a circuit board, switches on said housing allowing selective communication of signals through said receiver/transmitter; and
   a battery secured to said circuit board by at least one electrically conductive pin, said electrically conductive pin contacting an upper face of said battery to provide electrical communication to said circuit board, and said pin being generally symmetrical about a central axis of said pin;
   a plurality of said electrically conductive pins spaced about a center axis of said battery; and
   said pins have an enlarged upper portion which contacts an upper surface of said battery.

6. A remote signaling device as recited in claim 5, wherein said upper surface is generally spherical.

7. A remote signaling device as recited in claim 5, wherein a generally cylindrical and smaller outer diameter portion of said pin extends from a portion of said pin inserted into a hole in said board upwardly to said enlarged portion.

8. A remote signaling device as recited in claim 7, wherein a transition portion extends in a generally tapered shape between said cylindrical portion and said enlarged portion.

9. A remote signaling device as recited in claim 8, wherein said transition portion contacts said upper surface of said battery.

10. A remote signaling device as recited in claim 9, wherein a tab portion of said pin on a remote side of said cylindrical section relative to said enlarged portion has an outer diameter and larger than an outer diameter fit into a hole in said integrated circuit board, and said tab portion providing a stop on said hole and against an upper face of said circuit board.

11. A remote signaling device as set forth in claim 5, wherein said pin extending from said circuit board along a length of said battery to contact said upper face of said battery such that said pin is secured to said circuit board below said battery, but provides electrical communication through a contact with an outer face of said battery.

12. A remote signaling device for a vehicle comprising:
   a housing incorporating a receiver/transmitter and a circuit board, switches on said housing allowing selective communication of signals through said receiver/transmitter;
   a battery secured to said circuit board by at least one electrically conductive pin, said electrically conductive pin contacting an upper face of said battery to provide electrical communication to said circuit board, and said pin being generally symmetrical about a central axis of said pin;
   a tab on said pin has an enlarged outer diameter which abuts an upper surface of said circuit board, and an insertion portion of said pin extending downwardly into a hole of said circuit board, said tab portion providing a stop to properly position said pin; and
   said pin having an enlarged upper portion which contacts an upper surface of said battery, and said tab portion ensuring said enlarged upper portion will properly contact said upper surface of said battery.

13. A remote signaling device as set forth in claim 12, wherein said pin extending from said circuit board along a length of said battery to contact said upper face of said battery such that said pin is secured to said circuit board below said battery, but provides electrical communication through a contact with an outer face of said battery.

14. A remote signaling device for a vehicle comprising:
   a housing incorporating a receiver/transmitter and a circuit board, switches on said housing allowing selective communication of signals through said receiver/transmitter; and a battery secured to said circuit board by a plurality of electrically conductive pins spaced about a central axis of said battery, said electrically conductive pins being inserted into holes in said circuit board at a lower end, and having a tab portion abutting a face of said circuit board to properly position said pins in said circuit board, and said pins having an enlarged upper portion contacting an upper surface of said battery.

* * * * *